United States Patent
Mousa et al.

(10) Patent No.: US 11,003,828 B1
(45) Date of Patent: May 11, 2021

(54) SYSTEM AND METHOD FOR LAYOUT ANALYSIS USING POINT OF INTEREST PATTERNS AND PROPERTIES

(71) Applicant: Mentor Graphics Corporation, Wilsonville, OR (US)

(72) Inventors: Sherif Hany Riad Mohammed Mousa, Beaverton, OR (US); Jea Woo Park, Tualatin, OR (US); Michael White, Tigard, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/983,549

(22) Filed: Aug. 3, 2020

(51) Int. Cl.
*G06F 30/392* (2020.01)
*H05K 3/00* (2006.01)

(52) U.S. Cl.
CPC ......... *G06F 30/392* (2020.01); *H05K 3/0005* (2013.01)

(58) Field of Classification Search
USPC ........................................................ 716/119
See application file for complete search history.

(56) References Cited

U.S. PATENT DOCUMENTS

| | | | |
|---|---|---|---|
| 8,402,397 B2 | 3/2013 | Robles et al. | |
| 10,691,869 B2* | 6/2020 | Abouelseoud | G06F 30/392 |
| 2016/0125120 A1* | 5/2016 | Yu | G06F 30/398 |
| | | | 716/52 |
| 2018/0307791 A1* | 10/2018 | Mousa | G06F 30/398 |

OTHER PUBLICATIONS

Jayaram, Mousa et al., "Model based CAOPC flow for memory chips to improve performance and consistency of RET solutions", J, Proc. SPIE. 11327, Optical Microlithography XXXIII!, Mar. 23, 2020, 11 pgs.
Hany, Seoud, et al., "Model based cell-array OPC development for productivity improvement in memory device fabrication", Proc. SPIE. 10587, Optical Microlithography XXXI, Mar. 20, 2018, 7 pgs.
Ding, Duo, et al., "High Performance Lithographic Hotspot Detection using Hierarchically Refined Machine Learning", 16th Asia and South Pacific Design Automation Conference (ASP-DAC 2011), Jan. 2011, p. 776-780.
Hany, Sherif, "Integrating Pattern Matching with DFM Properties to Enhance and Optimize Layouts", Sep. 2018, 7 pgs.
Hany, Sherif, "Want Improved design optimization? Try integrating pattern matching with DFM properties", https://blogs.mentor.com/calibre/blog/2017/12/04/want-improved-design . . . , Jul. 12, 2020, 5 pgs.

* cited by examiner

*Primary Examiner* — Mohammed Alam

(57) ABSTRACT

Systems and methods for layout analysis using unit cell properties. A method includes receiving a layout design and analyzing the layout design to identify unit cells in the layout design. The method includes designating points of interest each corresponding to a respective one of the unit cells and classifying the unit cells into a plurality of classifications using the points of interest and the corresponding properties. The method includes identifying unique patterns of the unit cells, and producing a reduced layout including the unique patterns of unit cells. The method includes performing layout processing on the reduced layout and propagating the process results from each of the unique patterns of unit cells in the reduced layout to other unit cells of the layout design having the same classification.

20 Claims, 7 Drawing Sheets

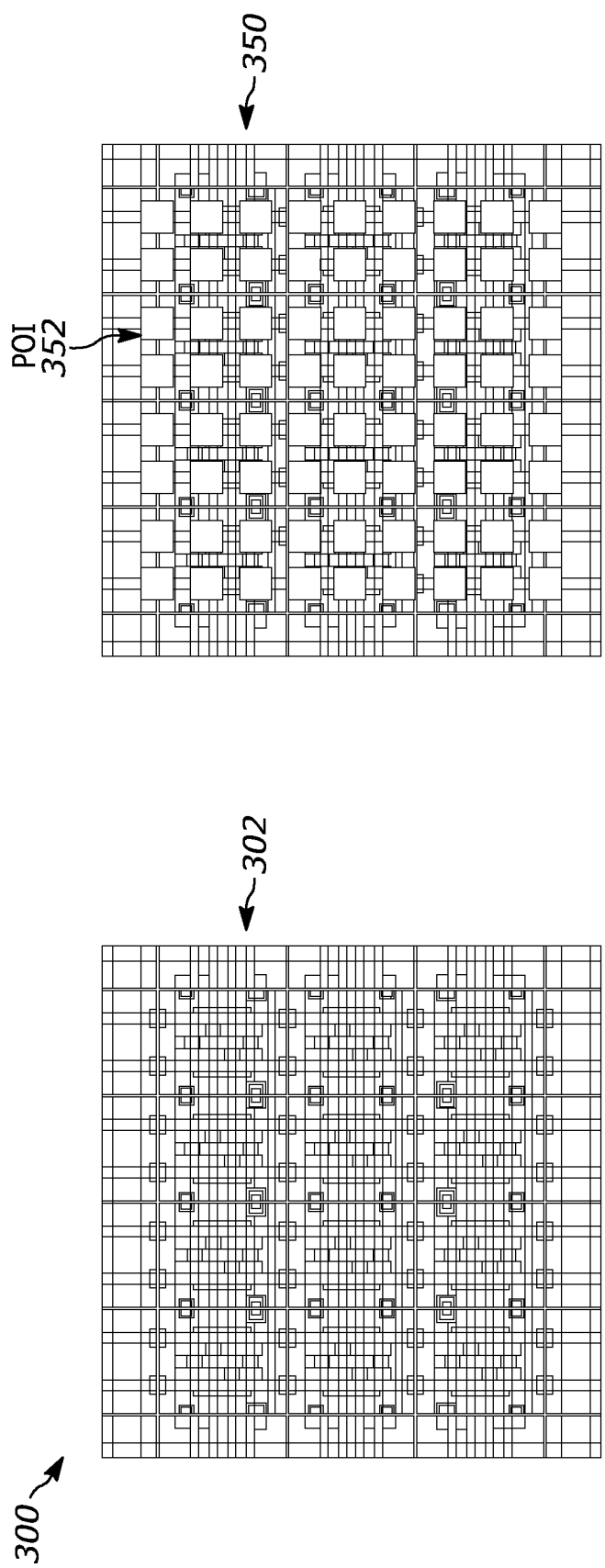

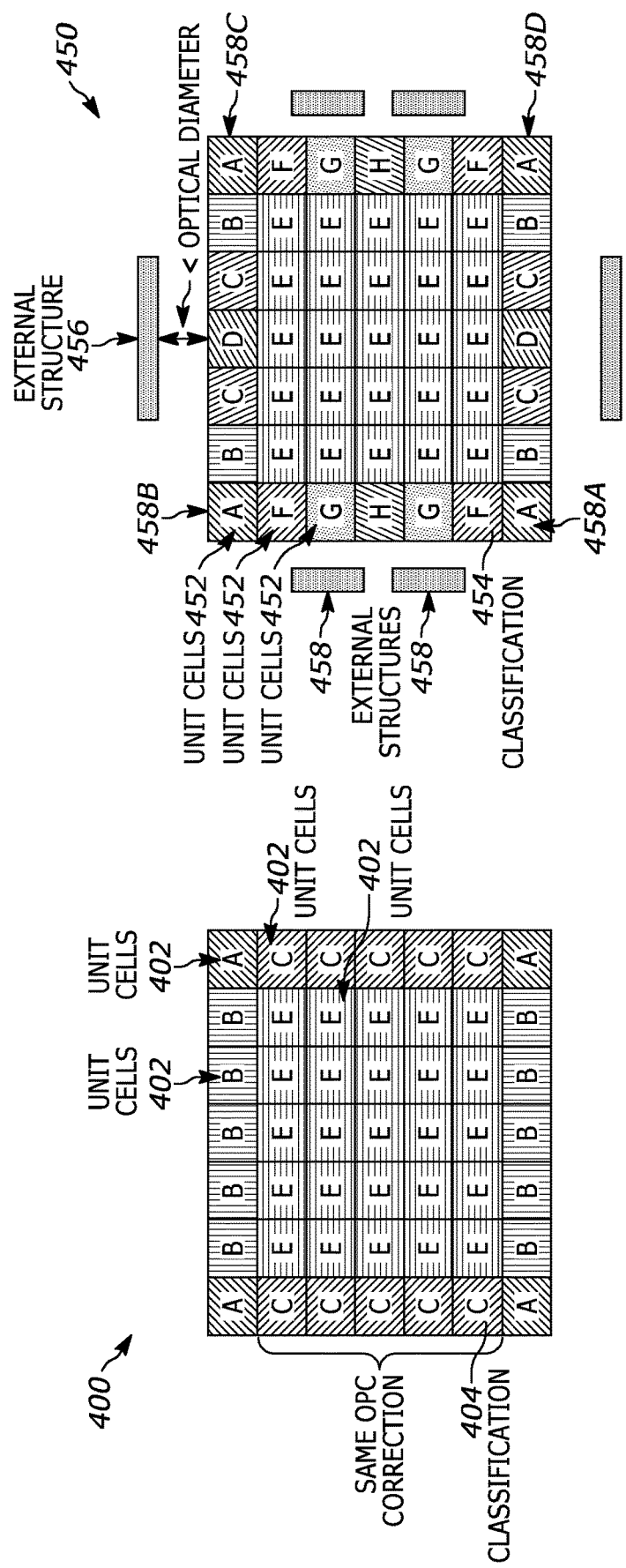

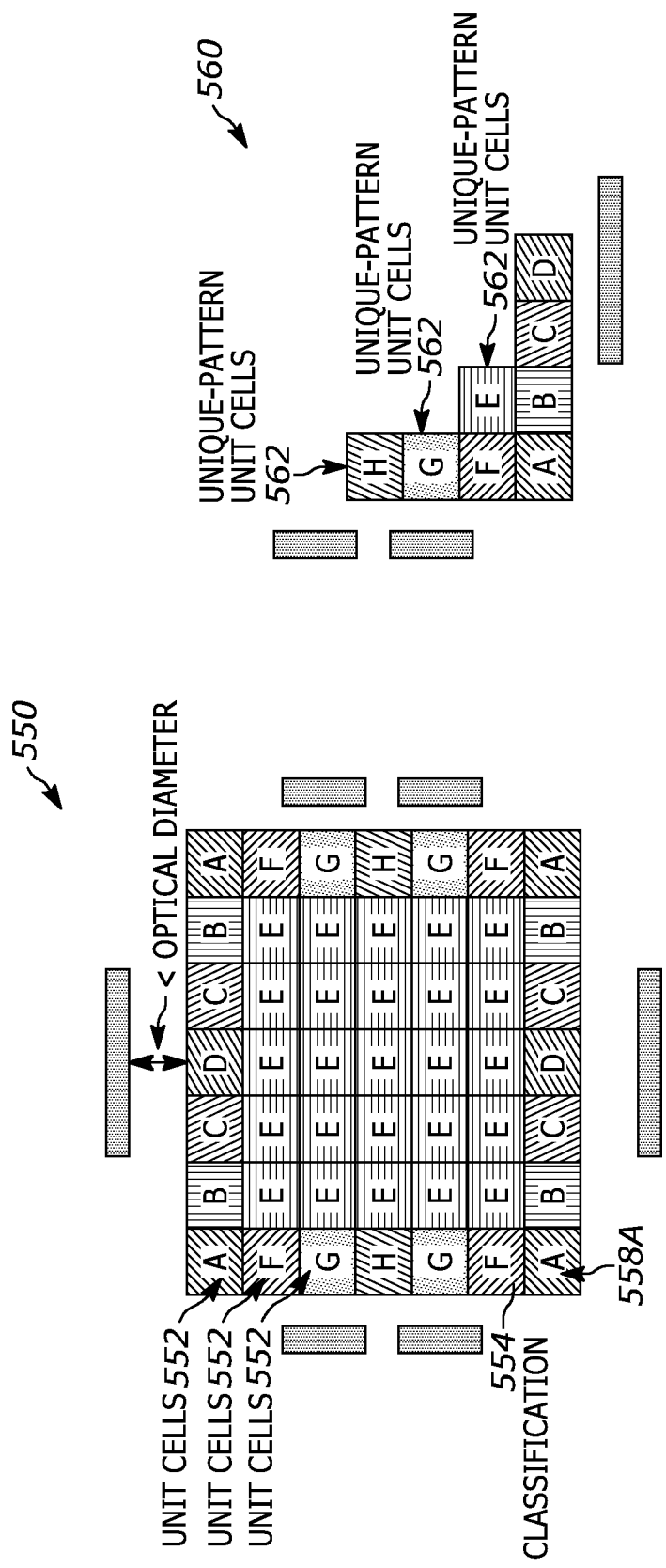

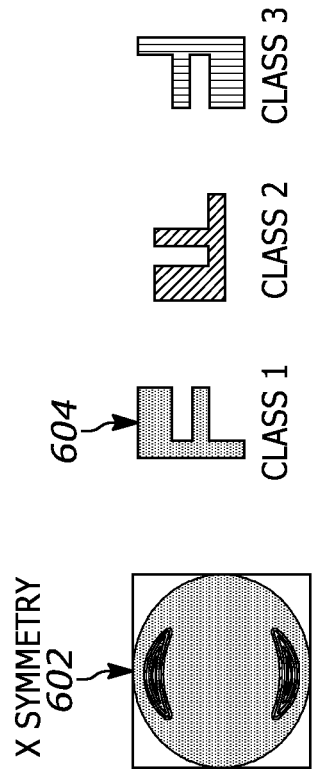
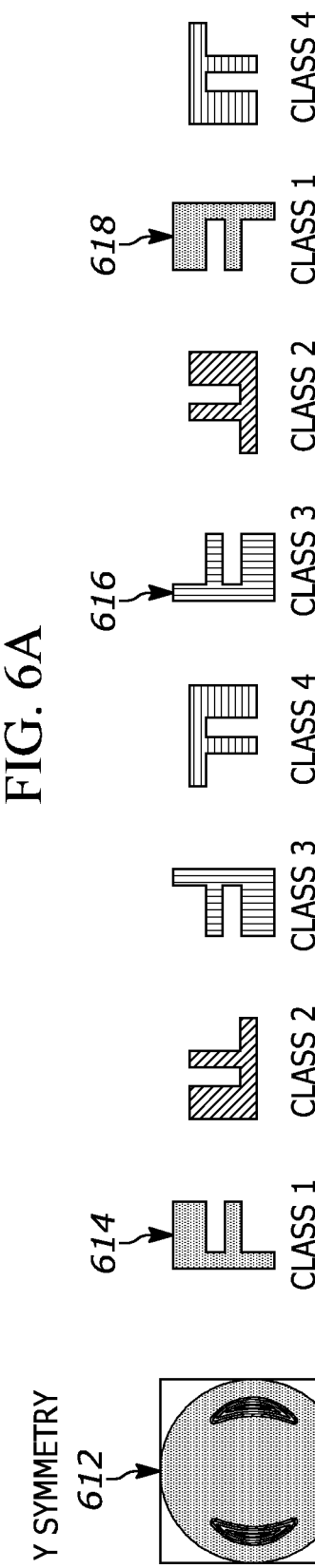
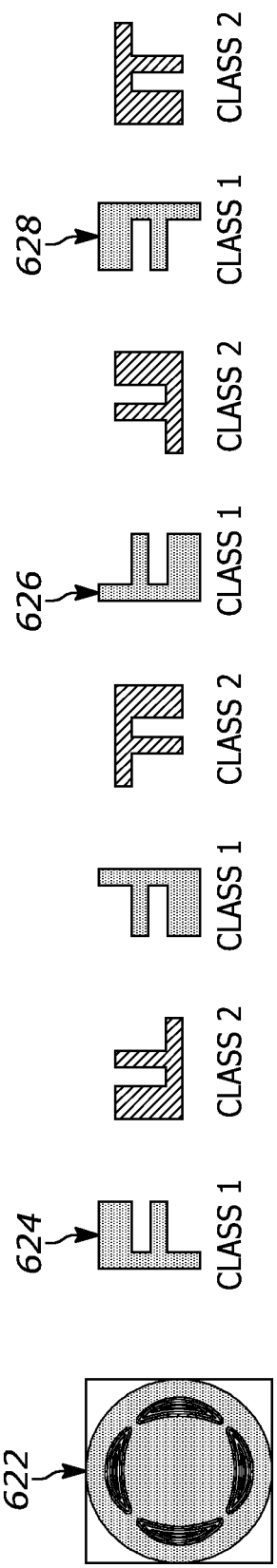
FIG. 6A
FIG. 6B
FIG. 6C

SYSTEM AND METHOD FOR LAYOUT ANALYSIS USING POINT OF INTEREST PATTERNS AND PROPERTIES

TECHNICAL FIELD

The disclosed technology is directed techniques for circuit design, testing, and manufacturing. Various implementations of the disclosed technology may be particularly useful for designing and validating layout designs for manufacturability.

BACKGROUND OF THE DISCLOSURE

As designers and manufacturers continue to shrink the size of circuit components, the shapes reproduced on a substrate through photolithography become smaller and are placed closer together. This reduction in feature size and spacing increases the difficulty of faithfully reproducing a circuit image intended by the design layout onto the substrate and can create flaws in a manufactured device. To address the problem, one or more resolution enhancement techniques are often employed to improve the resolution of the image that the mask forms on the substrate during the photolithographic process. As circuit designs become smaller and resolution increases, the design complexity and requirements increase. Also, the number of metal layers increase with different electrical/process characteristics.

One resolution enhancement technique, "optical proximity correction" or "optical process correction" (OPC), attempts to compensate for light diffraction effects. When light illuminates the photomask, the transmitted light diffracts, with light from regions with higher special frequencies diffracting at higher angles. The resolution limits of the lens in a photolithographic system make the lens act effectively as a low-pass filter for the various spatial frequencies in the two-dimensional layout. This can lead to optical proximity effects such as a pull-back of line-ends from their desired position, corner rounding, and a bias between isolated and dense structures. The optical proximity correction adjusts the amplitude of the light transmitted through a lithographic mask by modifying the layout design data employed to create the photomask. For example, edges in the layout design may be adjusted to make certain portions of the geometric elements larger or smaller, in accordance with how much additional light exposure (or lack of exposure) is desired at certain points on the substrate. When these adjustments are appropriately calibrated, overall pattern fidelity (printed vs. targeted) is greatly improved, thereby reducing optical proximity effects.

In addition to the edge adjustment, sub-resolution assist features (SRAF) are often inserted to address the iso-dense bias problem. Sub-resolution assist features, sometimes also known as "scattering bars," are themselves too small to be resolved by the imaging system. When they are inserted into the layout, sub-resolution assist features can, however, provide a dense-like environment for isolated features. As such, isolated features will print more like dense features.

After a layout is designed, it should be verified. Design verification of the entire layout can be extremely expensive in terms of computation time, memory requirements, and costs. For a design having hundreds of millions of or even billions of points of interest, current processors can require thousands of processors to operate for multiple days using huge amounts of memory, and many processes may not finish at all. Any technique that can speed up the process or require less computing resources is highly desirable.

SUMMARY OF THE DISCLOSURE

Various disclosed embodiments include a method performed by a computer system for improved layout analysis using properties, that reduces processing time and memory requirements. The method includes receiving a layout design for a lithographic process and analyzing the layout design to identify unit cells in the layout design. Each unit cell represents a repeating geometric structure in the layout design. The method includes designating points of interest each corresponding to a respective one of the unit cells, and storing properties corresponding to each point of interest in a hierarchical database. The method includes classifying the unit cells into a plurality of classifications using the points of interest and the corresponding properties. The method includes identifying unique patterns of the unit cells, where each unique pattern represents classification of a unit cell that is not a transformation of another unit cell with the same classification. The method includes producing a reduced layout including the unique patterns of unit cells. The method includes performing layout processing on the reduced layout to produce process results. The method includes propagating the process results from each of the unique patterns of unit cells in the reduced layout to other unit cells of the full layout design having the same classification.

In various embodiments, each unit cell represents a geometric structure for a bit of a memory. In various embodiments, each unit cell represents a geometric structure for a logic gate. In various embodiments, the properties corresponding to each point of interest includes one or more of the location of the corresponding unit cell, the orientation of the corresponding unit cell, the location context of the corresponding unit cell with respect to other unit cells, or the location context of the corresponding unit cell with respect to external structures. In various embodiments, the location context of the corresponding unit cell with respect to other unit cells or with respect to external structures is determined according to a predetermined interaction distance size. In various embodiments, the process results include layout modifications and process metadata, and propagating the process results from each of the unique patterns of unit cells in the reduced layout to other unit cells of the full layout design having the same classification includes propagating only the process metadata and not propagating the layout modifications. In various embodiments, the process metadata includes the properties corresponding to each point of interest corresponding to each unit cell in the reduced layout. In various embodiments, the process metadata includes feature vectors corresponding to each unit cell in the reduced layout. In various embodiments, the properties corresponding to each point of interest corresponding to each unit cell includes the classification of the respective unit cell.

Disclosed embodiments include a computer system having a processor and an accessible memory, configured to perform processes as disclosed herein. Disclosed embodiments include a non-transitory computer-readable medium storing with executable instructions that, when executed, cause one or more computer systems to perform processes as disclosed herein.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 3A and 3B illustrate a process for generating points of interest (POIs) for a design in accordance with disclosed embodiments;

FIGS. 4A and 4B illustrate classification techniques of unit cells of a circuit design in accordance with disclosed embodiments;

FIGS. 5A and 5B illustrate generation of a reduced layout in accordance with disclosed embodiments;

FIGS. 6A-6C illustrate classification based on both pattern orientation and light source symmetry, in accordance with disclosed embodiments.

DETAILED DESCRIPTION

Figure 1:
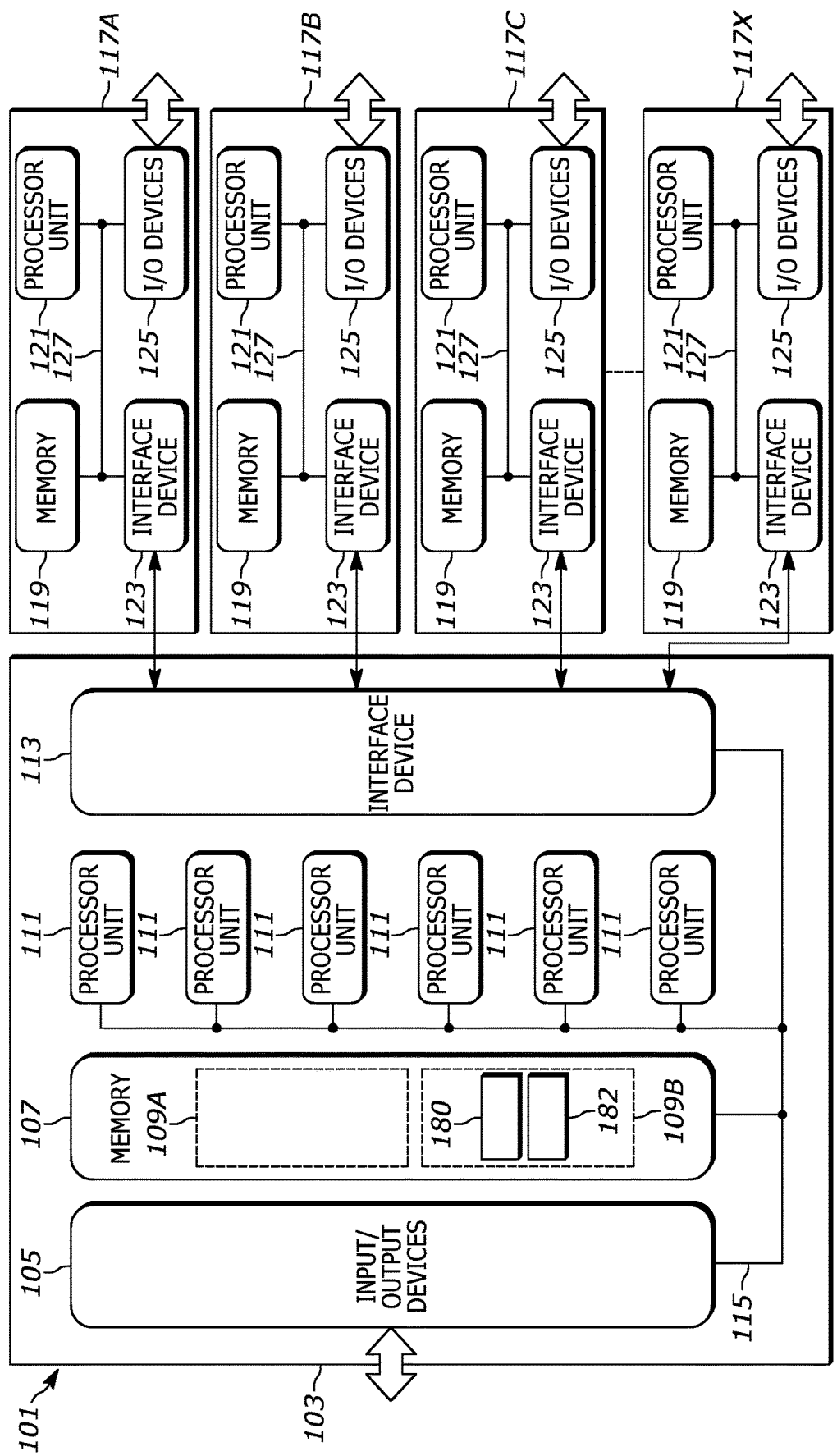
FIGS. 1 and 2 illustrate components of a computer system that may be used to implement various embodiments of the disclosed technology.

The Figures discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

General Considerations

Various aspects of the present disclosed technology relate to techniques of design validations of circuit designs. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "partition," and "extract" to describe the disclosed methods. Such terms are high-level descriptions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various processes described herein may be implemented using computer-executable software instructions executed by one or more programmable computing devices. Because these processes may be implemented using software instructions, the components and operation of a generic programmable computer system on which various embodiments of these processes may be employed will first be described. Further, because of the complexity of some electronic design and testing processes and the large size of many circuit designs, various electronic design and testing tools are configured to operate on a computing system capable of simultaneously running multiple processing threads. The components and operation of a computer system having a host or master computer and one or more remote or slave computers therefore will be described with reference to FIG. 1. This operating environment is only one example of a suitable operating environment, however, and is not intended to suggest any limitation as to the scope of use or functionality of any implementations of the invention.

In FIG. 1, the computer system 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other non-transitory storage medium that can be used to store desired information. As used herein, the term "non-transitory" refers to the ability to store information for subsequent retrieval at a desired time, as opposed to propagating electromagnetic signals.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel, and can include any of the data discussed herein. Data 109B can specifically include a hierarchical database 180 and properties 182 as described herein; properties 182 may be stored in hierarchical database 180.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire®. microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
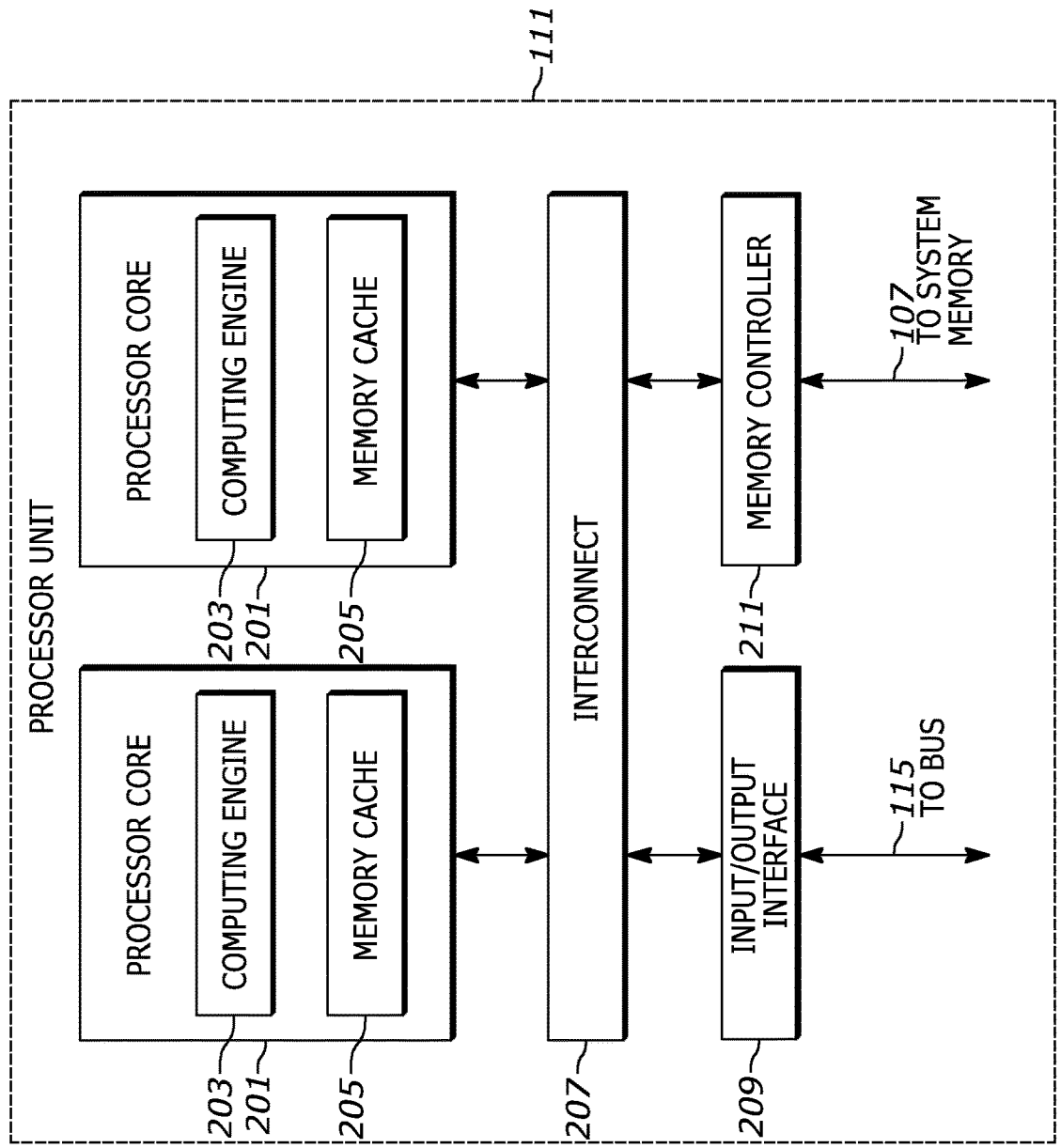

With some implementations of the invention, the master computer 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205.

As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation, and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the computing system 101 may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 123, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel®. Pentium®. or Xeon™ microprocessors, Advanced Micro Devices Athlon™ microprocessors or Motorola 68K/Coldfire®. microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the technology may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the computer system 101, the master computer 103 may be connected to one or more external data storage devices. These external data storage devices may be implemented using any combination of non-transitory computer readable media that can be accessed by the master computer 103. The computer readable media may include, for example, microcircuit memory devices such as RAM, ROM, EEPROM or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the computer system 101, one or more of the slave computers 117 may alternately or additions be connected to one or more external non-transitory data storage devices. Typically, these external non-transitory data storage devices will include data storage devices that also are connected to the master computer 103, but they also may be different from any data storage devices accessible by the master computer 103.

It also should be appreciated that the description of the computer system 101 illustrated in FIG. 1 and FIG. 2 is provided as an example only, and it not intended to suggest any limitation as to the scope of use or functionality of various embodiments of the invention.

Circuit Design Flow and Resolution Enhancement Techniques

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design (and may simply be referred to as a "layout"). The geometric elements, which typically are polygons, define the shapes that will be created in various layers of material to manufacture the circuit. Typically, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as the IC Station product from Mentor Graphics Corporation or the Virtuoso product from Cadence, allow a designer to custom design the layout, which is mainly used for analog, mixed-signal, radio frequency, and standard-cell designs.

Integrated circuit layout descriptions can be provided in many different formats. The Graphic Data System II (GDSII) format is a popular format for transferring and archiving two-dimensional graphical integrated circuit (IC) layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics Corporation, and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Typically, a designer will perform a number of verification processes on the layout design. For example, the layout design may be analyzed to confirm that it accurately represents the circuit devices and their relationships described in the device design. In this process, a layout versus schematic (LVS) tool extracts a netlist from the layout design and compares it with the netlist taken from the circuit schematic. LVS can be augmented by formal equivalence checking, which checks whether two circuits perform exactly the same function without demanding isomorphism.

The layout design also may be analyzed to confirm that it complies with various design requirements, such as minimum spacings between geometric elements and minimum linewidths of geometric elements. In this process, a DRC (design rule checking) tool takes as input a layout in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a photomask (mask) must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As discussed previously, one or more resolution enhancement techniques (RETs) are often employed to improve the resolution of the image that the mask forms on the substrate during the photolithographic process. One of these techniques is OPC. OPC can be rule-based, model-based, or both. In rule-based OPC, the proximity effects are characterized and specific solutions are devised for specific geometric configurations. The layout design is then searched using a DRC tool or a geometric-based software engine to find these geometric configurations. Once they are found, the specific solutions are applied.

Optimizing the design typically uses an iterative process of performing an RET process, such as an OPC process, and performing verification, including simulation. Each time the design is adjusted in the RET process, the new design must be rigorously verified through simulation. The corrections needed in the OPC process can be strongly influenced by the location of the particular design structure on the chip. For example, circuit structures located near the edge of the layer may require different corrections than circuit structures located in the "interior" of the layer. These characteristics may be similar at different but corresponding locations on the layer. For example, the corrections required for circuit structures on the left edge of the layer may be the same—but mirrored—as the corrections required for circuit structures are corresponding locations on the right edge of the layer. The smaller the size or the more complex the design is, the more difficult the processes such as physical verification, hotspot detection, and yield analysis are to perform. These can then require more advanced and sophisticated techniques for validation.

Disclosed embodiments, by contrast, reduce verification and simulation requirements by identifying unit cells in a design, classifying each of the unit cells, identifying unique representative patterns in the unit cells, and performing verification/simulation on (typically) only each unique pattern, rather than each structure in the entire design. The verification/simulation results for each unique pattern can then be propagated to each other unit cells of the same pattern. A process as disclosed ensures consistent displacement of optically-similar mask polygon edges across different cells and design tiles. As used herein, a unit cell may refer to any delineated or discrete portion of a circuit design, and may thus include representative or hierarchical design patterns, polygon fragments, polygons, groups of polygons, circuit design blocks, discrete circuit design elements, design cells or sub-cells of a hierarchical circuit design, partitioned segments of a circuit design, and the like. In some examples, unit cells may refer to geometrically-similar bit cells in a design (such as in a memory chip), and an objective of OPC techniques is to ensure that, once manufactured, each unit cell behaves identically.

FIGS. 3A and 3B illustrate a process for generating points of interest (POIs) for a design. Each unit cell is represented by a "point of interest," which can be (but is not necessarily) designated as the center of each unit cell. A system as disclosed herein can use any number of techniques to designate representative POIs. For example, in an original layer (part of an input design), the system can select the centers of the vias in the layout. As another example, in a derived layer (such as using design rule checking or yield enhancement tools) e.g. the system can select the centers of the vias in the layout but also perform prefiltering such as focusing on vias that have neighboring vias, line-ends of specific dimensions, and others. As another example, in an advanced derived layer, in addition to other processes described above, the system can determine that the POI should be close to a specific device or device type or some critical net defined by its source name. As another example, in an advanced derived layer, in addition to other processes described above, but the system can apply a schematic topology that is identified on source netlist using netlist parameters do identify POIs.

FIG. 3A illustrates an example of a full-chip design 300 comprised of unit cells, such as may be used for a memory chip, where each bit of the memory should behave identically. While not detailed here, those of skill in the art recognize how memory bits are formed from individual semiconductor structures connected by bit-lines and word-lines. In such a design 300, the structure for each memory bit, as represented in the design, can be considered a unit cell. In other implementations, where the design does not represent a memory chip, unit cells can be used to represent specific "building block" geometric structures or hierarchical patterns of the design, such as logic gates and other structures that similarly should behave consistently throughout the design. In such embodiments, however, each unit cell may represent a repeated or periodic structure on the chip such as standard cells, logic gates, and other structures that are repeated over the layout in that multiple instances of the same design element are present in different portions of the layout.

FIG. 3B illustrates a full-chip layout design 350 (corresponding to full chip design) where POIs 352 have been identified corresponding to each unit cell within a target layer of all cells across the chip or portion of the chip. Disclosed systems and methods use POIs 352 to represent each unit cell for classification and pattern-analysis purposes.

A system as disclosed herein can analyze the full-chip layout design 350 to identify unit cells, then designate a POI 352 corresponding to each unit cell. A system as described herein can create a hierarchical database for the design, which includes details on each of the unit cells and corresponding POIs, geometric structures such as mask layers required for the design, standard cells, and critical areas (such as edges/periphery, proximity to external structures, a core array, and any relevant controlling logic) for the design, as described in more detail below.

The coverage of the full chip (or designated portion) may be accomplished by collecting POIs that cover the center of each 2D structure in the full chip or design portion, e.g., including vias and critical corners and line ends for 1D structures, e.g., metal layers. The hierarchical database can store information about the context used for classification of each POI by considering interaction distance in the form of a rectangular halo which is greater than the interaction distance (optical diameter) of the optical model to take into account the interaction distance of the resist model. This interaction distance is useful in pattern extraction to ensure lithography simulation output accuracy and context sensitivity. The contexts described above can be stored as properties of each unit cell in the hierarchical database, and can be stored as properties of patterns of structures that can be within a single unit cell or extended across multiple unit cells.

FIGS. 4A and 4B illustrate classification techniques of unit cells of a circuit design, as represented by POIs, such as corresponding to a single layer or portion of the layer. FIG. 4A illustrates an initial classification process that a system can perform to coarsely group unit cells into different groups. In some examples, the system may receive an initial classification from a designer or engineer. In FIG. 4A, layout design 400 is divided into unit cells 402. Each of the unit cells is classified into a classification 404, represented in this figure by a letter identifier, based on the geometric shapes of the structures of the unit cell. As used herein, classification may refer to any format by which different unit cells are differentiated from one another. In the example of FIG. 4A, there are four groups/classifications A, B, C, and E, where classification A represents unit cells at the corners, bounded by two edges, classification B represents top-edge and bottom-edge unit cells, classification C represents left-edge and right-edge unit cells, and classification E represents unit cells in the interior or "core" of the design. In general, each of the unit cells with the same classification can be optimized using the same OPC techniques, translated, rotated, or mirrored corresponding to the relative location of each of the unit cells. Similarly, verification processes are, in general, the same for each of the unit cells with the same classification, so that if an RET/verification/simulation process is completed for one of the unit cells, then the corresponding process for the other unit cells having the same classification can be assumed to be correct.

FIG. 4B illustrates an automated, more-precise pattern/property aware approach for classification according to disclosed embodiments. An approach as in FIG. 4B recognizes that increased granularity can be advantageous in classification, and classifies the same number and form of the unit cells as represented in FIG. 4A into eight groups/classifications A-H. In a classification process as illustrated in FIG. 4B, each POI corresponding to each unit cell is associated with a corresponding classification.

In FIG. 4B, layout design 450 is divided into unit cells 452. Each of the unit cells 452 is classified into a classification 454, represented in this figure by a letter identifier. A pattern/property aware approach as disclosed herein recognizes that other location-based effects can be addressed using context sensitivity regarding neighboring unit cells or structures, since the OPC techniques used for a given unit cell may actually influence or change the OPC technique needed for its neighboring cells. That is, not only edges or corners may affect the required OPC adjustments for a first cell, but the OPC adjustments made for its neighboring cells may affect the required OPC adjustments for the first cell. According to disclosed embodiments, the system considers, in addition to intra-cell targets, both inter-cell and cell periphery areas to account for SRAFs. The POIs are considered the core locations for all the pattern instances. To detect the impact of context on each pattern, a proper halo or interaction distance size can be identified or specified to ensure lithography simulation output accuracy; this halo is dictated by the process/optical diameter of the simulation that leads to large and highly-overlapping windows when compared to the original cell dimensions. The context of each pattern can include the location context of the corresponding unit cell with respect to other unit cells, including both immediate-neighbor cells and other cells within the interaction distance size, and/or the location context of the corresponding unit cell with respect to external structures that are within the interaction distance size.

In the example of FIG. 4B, unit cells with classification E (interior cells) and classification A (corner cells) can be treated the same as in FIG. 4A. However, classification B cells are treated differently since they are top-edge and bottom-edge unit cells that are, in this case, next to classification A cells and possibly influenced by an external structure 456. Classification D cells are top-edge and bottom-edge unit cells that are, in this case, within an optical diameter of external structure 456, where the optical diameter refers to a distance in which the external structure 456 is close enough to the unit cells that OPC techniques should be used to address interactions in the manufacture process between the external structure 456 and the nearby unit cells. Classification C cells are top-edge and bottom-edge unit cells that are, in this case, within an optical diameter of external structure 456 and also influenced by the OPC techniques used to address classification D and classification B cells. Note that these classification examples are non-limiting to any particular implementation. For example, the interior cells shown as classification E will not necessarily be all of the same classification if they do not represent the same structures, but instead could represent several different classifications depending on which repeating structures are presented. Each classification process will be specific to the actual structures represented in the layout design.

Similarly, in the example of FIG. 4B, classification G cells are left-edge and right-edge unit cells that are, in this case, within an optical diameter of individual external structures 458, and may be influenced by the OPC techniques used to manufacture their respective neighboring cells. Classification H cells are left-edge and right-edge unit cells that are, in this case, at least partially within an optical diameter of both external structures 458, and may be influenced by the OPC techniques used to manufacture their respective neighboring cells. Classification F cells are right-edge and left-edge unit cells that are, in this case, next to classification A cells and possibly influenced by an external structure 458 and neighboring classification A cells and classification G cells.

As illustrated in FIG. 4B, disclosed embodiments use a more-precise classification of unit cells that considers edge effects, neighboring-cell effects (the location context of the unit cell with respect to other unit cells that includes both immediate neighbor cells and further-away neighbor cells), and external-structure effects (the location context of the corresponding unit cell with respect to external structures), which is referred to herein as a pattern/property aware classification.

During classification, a system as described herein can update the hierarchical database for the design to include the classifications for each of the unit cells and corresponding POIs. Note that, while letters are used to designate classifications in this example, disclosed embodiments may more typically use a numeric or other designator to represent each classification.

The classification process also produces identification of unique patterns of the unit cells 352, which can be stored in the database as properties of each unit cell and corresponding POI. Identifying patterns based on the automatically-placed POIs and the large halo size ensures both full chip scanning and coverage in addition to having adequate context for each pattern. The patterns are then analyzed to identify a unique representative for each group, taking into account both orientation and transformations. Additional optimization techniques can be used in the selection of the unique locations to improve the lithography simulation accuracy and enable uniform contexts.

The classification process can include using a machine learning (ML) system for classification and classification predictions of the POIs across the chip. The ML system processes can include classification, such as using supervised machine learning, and clustering, such as by unsupervised machine learning. The ML system can perform, for example, feature generation to generate feature vectors corresponding to each unit cell, pattern, and/or POI. Feature vector generation is not limited to only one layer as in lithographic applications, but it can consider multiple layer in case of design-for-manufacturing (DFM) and yield analysis. Vias, overlaying metals, and underlaying metals can be considered in addition to the context size for individual polygons on the same drawn mask layer.

Each feature vector can include properties related to geometries, dimensions, pattern descriptions, and others. In physical verification where several checks are invoked on millions of locations, the machine requirements significantly grow for both feature generation as well as the ML stage itself. Some deep learning algorithms can require a digitized image such as a bitmap representation, so that the vector can have thousands of elements. These large vectors can make feature generation very memory intensive, impacting runtime, making the full chip verification almost impossible if vectors are generated, stored, and processed for every element of the chip.

As noted above, feature vectors can include bitmap representations, such as monochrome/bitonal representations, grayscale representations, color representations, or normalized or rounded versions of any of these. Feature vectors can include proprietary formats, such as the formats used by machine learning processes of the CALIBRE SONR product of Mentor Graphics Corporation. A system as disclosed herein can store these feature vectors and related data as the properties or metadata associated with each of the unit cells. A ML system as used herein can be implemented, for example, using the CALIBRE product of Mentor Graphics Corporation or other suitable ML system for pattern identification, classification, and prediction.

For example, each of the classification A cells in FIG. 4B can be considered as the same unique pattern, including the actual structures represented and the context of the cell locations, differing only in actual location and orientation. The system can store the location and orientation as properties of each unit cell and corresponding POI. In this example, cell 458A can have properties of "classification A, location W, orientation 1," where W indicates the lower-left corner; cell 458B can have properties of "classification A, location X, orientation 2," where X indicates the upper-left corner and orientation 2 is a vertical mirror of orientation 1; cell 458C can have properties of "classification A, location Y, orientation 3," where Y indicates the upper-right corner and orientation 3 is a horizontal mirror of orientation 2; and cell 458D have properties of "classification A, location Z, orientation 4," where Z indicates the lower-right corner and orientation 4 is a horizontal mirror of orientation 1. Of course, the actual manner off indicating such properties can differ in various implementations. Each unit cell and its corresponding POI can have associated properties of its classification, location, and orientation. Note that orientation may be based on light sources in the lithographic processes, as described in more detail below. The properties as described herein can be generally used as or included in metadata associated with each unit cell, and such metadata can be stored in the hierarchical database.

In this example, classification A is a unique pattern, and so testing and verification processes performed for any one of the classification A unit cells can be applied to all other classification A unit cells.

The system identifies each of the individual patterns, such as by using the generated hierarchical database information including properties and other metadata, and annotates each pattern POI with information about the context, class ID, orientation, transformation, etc. The metadata can be contained in form of DFM properties that are efficiently stored for further processing of each POI. Once the pattern analysis and grouping of unit cells based on classification take place, a small set of patterns which are found to be unique representations of the various groups of patterns are selected and used as representative of the whole chip or relevant portion. This small representative subset, the reduced layout, is used for generation of RET solution and the resulting RET solution is used for the whole chip. The amount of reduction or the number of patterns in the representative subset compared to the number of patterns on the whole chip can depend on the interaction distance used to define the context for classification. A large interaction distance would likely lead to a larger number of representative patterns and thus reduction in turnaround time would not be as significant compared to a case where an RET solution is generated for the whole chip. A smaller interaction distance would generate fewer representatives, but a too-small context could classify optically dissimilar structures as geometrically similar thus leading to same RET solution for optically dissimilar patterns, resulting in poor lithographic quality.

A system as disclosed herein can then use the unique patterns to generate a reduced layout design of the design being analyzed. FIGS. 5A and 5B illustrate generation of a reduced layout. FIG. 5A is a full layout of a design 550 that corresponds to the example of FIG. 4B, with each of the unit cells 552 classified into a classification 554. As described above, it is assumed in this example that the system has stored, for each unit cell 552, associated properties of its classification, location, and orientation.

Using the metadata/properties, such as design for manufacturing properties, the system identifies unit cells 552 that correspond to a unique pattern, generally a single representative unit cell of each classification. The system removes any duplicate unit cells to produce a reduced layout that only includes unique-pattern unit cells.

FIG. 5B illustrates a reduced layout 560 corresponding to design 550 in accordance with disclosed embodiments. Reduced layout 560, in this example, includes only one of each unique-pattern unit cell 562, and can include, for example external structures or other elements that affect the unique-pattern unit cells 562. In this simplified example, where design 550 includes 49 unit cells 552, the reduced layout 560 includes only 8 unique-pattern unit cells 562.

The reduced layout 560 illustrates that the number of unique locations (unique-pattern unit cells or corresponding POIs) represents a significantly small portion of the full chip layout. The reduced layout enables a significant runtime reduction, since the required simulations are limited to the unique locations, rather than the full-chip simulation performed by the traditional OPC approaches. Reducing the simulation computation portion of the OPC flow to a very few locations that represent the full chip enables the practical use of very sophisticated OPC field solvers (such as inverse lithography) that can provide higher resolution and accuracy with a much shorter and more reasonable runtime.

The system can then perform layout processing on the reduced layout. The layout processing can include, for example, performing RET processes, for example including an OPC process, defining SRAFs, performing verification processes, performing simulation processes, and/or performing self-checking processes on the reduced layout. Any suitable RET, verification, and/or simulation processes can be performed as may be useful, and the performance of the system is improved by not needing to perform such processes on the entire chip or design, but only performing them on a representative portion of the entire chip or design, such as the reduced layout. The system stores the process results of any of these processes as associated with the respective unique-pattern unit cells.

The layout processing can include generation for SRAFs for the reduced layout. The SRAFs can then be used in a model-based OPC simulation on the reduced layout and the additional context can be used to generate the mask for the target patterns. The generation of SRAFs and model-based OPC over only a representative subset of the full chip as opposed to the full chip provides a significant improvement in the operation of the system as compared to traditional techniques either manual or rigorous simulation.

The classification and generation of a RET solution on representative set of patterns allows for same mask polygons for optically same patterns classified as same within the context of the interaction distance. Disclosed embodiments can employ cell-array OPC to specifically ensure that the edges of mask polygons classified as same within the context of interaction distance have the same set of displacements within the reduced layout. In other systems, model-based OPC simulations are known to be slightly inconsistent due to grid shifting effects. These inconsistencies result in OPC corrections on mask which are different for optically similar target pattern edges. The usage of cell-array OPC resolves similar issues leading to perfectly consistent displacement and resulting in at least equivalent or better lithographic quality.

Layout processing can also account for other layout modifications that can take place such as yield enhancement for consistent smart/dummy fill activities. Layout processing can also include pattern enhancement and editing, for example to address silicon catastrophic or out-of-specification failures, DFM soft-failures and issues. and/or general yield detractors. The layout changes are not limited to modifying polygons, but it can include annotating the reduced layout with metadata in the form of measured properties or ML prediction properties such as classification, clustering, or regression classIDs.

The layout processing can include performing a self-checking validation process to ensure that each stage adheres to the periodicity, symmetry, and consistency requirements of the lithography process. This helps achieving superior quality of results in terms of image-on-target, edge placement errors (EPE), and process variability bands. Such a self-checking validation process enable the three main concepts of design for testability (DFT); accessibility, controllability, and observability. Self-checking can take several forms of validating the consistency of changes, such as using multiple PM classifications to consistency of annotated properties, using hash functions for pairs, and others.

For accessibility, the self-checking validation process leverages the meta-data generated in hierarchical database and performs additional classification for both SRAF and OPC results for further analysis based on same POIs. This process can differentiate between information that exists on the reduced layout and full chip.

For controllability, the self-checking validation process can include selective options including interaction distance, SRAF existence distance, orientation control, etc.

For observability, the self-checking validation process can analyze the classification and periodicity of metadata and aligns them statistically to eliminate false violations and flag any issues that might occur in every stage. A symmetry checks can use the same POIs with a modified halo to check for local symmetry and identify missing elements such as SRAFs.

Validation processes can include machine learning processes using the properties and other metadata, such as including feature vectors. These ML processes can be performed, for example, using the CALIBRE product of Mentor Graphics Corporation. For any of the example validation processes described above, the system may use the reduced layout to improve the computational efficiency of such processes while nonetheless ensuring that validation results are obtained for the full chip design.

For example, the system can then propagate the results of the layout processing to the remainder of the chip design. The results associated with each unique-pattern unit cell are associated with each other unit cell of the same classification, modified as appropriate according to the target unit cell's properties as compared to the source unique-pattern unit cell's properties. That is, using the examples above, if unit cell 458B (classification A) is the source unique-pattern unit cell on which the layout processing has been performed and for which layout processing results have been stored, then these results can be propagated to unit cell 458A (also classification A). During propagation, before application, or at another appropriate time, the results propagated to unit cell 458A can be modified to account for the differences. In this example, cell 458A has properties including "classification A, location W, orientation 1" and cell 458B has properties including "classification A, location X, orientation 2." When the results are propagated from unit cell 458B to unit cell 458A, the results can be modified to according to the difference in orientation between orientation 2 and orientation 1 (e.g., by rotating the validation results of cell 458A to appropriately reflect orientation 2 of cell 458B).

While in some systems, the actual layout modifications, such as SRAFs, OPC structures, and other specific layout data is propagated to other cells, this can require a large amount of memory and time to accomplish. In disclosed embodiments, by contrast, process metadata such as including the properties is propagated between the unit cells, without propagating actual layout modifications produced by the validation processes. The propagated process metadata is used to ensure that the simulation/verification results are available for each unit cell and can be used to generate the layout modifications as necessary at a later time, taking into account the propagated metadata, modifications in orientation, and the layout modifications made to the unit cells in the reduced layout. The metadata may take any form or store any necessary data to apply the layout modifications determined through layout validations for a representative unit cell to other instances of unit cell in the circuit design.

In some cases, the propagated metadata can include vector properties describing the layout modifications. In specific implementations, the properties can be implemented as or include a CLASS ID property (exact classification within certain halo), an XFORM of pattern (covering transformation and orientation) to propagate the ML prediction class IDs (whether it is supervised or unsupervised ML), hierarchical information, and other metadata to link a given unit cell (or its corresponding POI) with the other "duplicate" unit cells with the same classification. In some cases, the propagated metadata can include feature vectors corresponding to each of the unit cells. In general, the reduced layout size can be impacted by several factors, such as the halo value and type showing the impact of context on the POI. The orientation of the light source and other process or application requirements help in reducing the layout, e.g., patterns in the corners to be treated as similar or different patterns, such as whether to receive the same classID or not.

When the layout modifications are not propagated with the metadata, the system can later generate the layout modifications for the duplicate unit cells according to the metadata and the original unit cell with the same classification. This can take many forms, including simply later copying the layout modifications from the original unit cell, based on the classification stored in the metadata, and then rotating or transforming those modifications according to orientation information or other parts of the metadata. In other cases, for example for fill applications where shapes are added, the shapes are added to the original unit cell and, at a later time, propagated to all duplicate unit cells to ensure consistency. As another example, OPC applications where shapes are modified, the system can simulate the original unit cell and generate retargeted/modified shapes that account for process impacts such as OPC and SRAF. These modified shapes can be rectilinear or curvilinear, and those modified shapes can, at a later time, be propagated to all duplicate unit cells. As another example, in machine learning applications, the metadata can indicate that specific process flows or applications are to be performed on the duplicate unit cells to generate layout modifications.

FIGS. 6A-6C illustrate classification based on both pattern orientation and light source symmetry, in accordance with disclosed embodiments. These factors can be used in the classification process described above.

The system can check the orientation of each unique patterns and group them according to symmetry about x-axis, y-axis, or both. The consideration of symmetry during classification is based on the symmetry of light source used in lithography. An optical model with a symmetric light source is expected to generate a symmetric RET solution for symmetric patterns, such as including OPC and SRAF information. This can further reduce the number of patterns during layout reduction through and subsequently turnaround time, without affecting the lithographic quality of the final mask while ensuring perfect geometric consistency.

In each of FIGS. 6A-6C, the same pattern is illustrated in the same set of different orientations using rotation and/or mirroring, to illustrate classification based on both pattern orientation and light source symmetry.

FIG. 6A illustrates X-directional symmetry for patterns identified with an X-symmetric light source 602. Examples of various classes that a system may classify unit cells into using a classification process with X-directional symmetry are illustrated in FIG. 6A. The patterns are classified according to different orientations, assuming that orientations that are mirrored/symmetric across the X axis are identical. For example, patterns 604 and 606 are both classified by the system as classification 1, since they are symmetric to each other with respect to the X axis, while pattern 608 is a different classification (classification 3) though it is symmetric to pattern 604 with respect to the Y axis.

FIG. 6B illustrates Y-directional symmetry for patterns identified with an Y-symmetric light source 612. Examples of various classes that a system may classify unit cells into using a classification process with Y-directional symmetry are illustrated in FIG. 6B. The patterns are classified according to different orientations, assuming that orientations that are mirrored/symmetric across the Y axis are identical. For example, patterns 614 and 618 are both classified by the system as classification 1, since they are symmetric to each other with respect to the Y axis, while pattern 616 is a different classification (classification 3) though it is symmetric to pattern 614 with respect to the X axis.

FIG. 6C illustrates both X- and Y-directional symmetry for patterns identified with an X- and Y-symmetric light source 622. Examples of various classes that a system may classify unit cells into using a classification process with both X- and Y-directional symmetry are illustrated in FIG. 6C. The patterns are classified according to different orientations, assuming that orientations that are mirrored/symmetric across the Y axis or the Y axis are identical. For example, patterns 624, 626, and 628 are all classified by the system as classification 1, since they are symmetric to each other with respect to either the X axis (patterns 624 and 626), or the Y axis (patterns 624 and 628).

Note that various individual classifications, in FIGS. 6A-6C, are rotations of each other; e.g., the classification 2 patterns are rotations of the classification 1 patterns and are symmetric to each other with respect to the X axis. Different classification techniques can use rotations, symmetries, or other characteristics to identify unique patterns, depending on such factors as light sources. This can further reduce the number of patterns produced without affecting the lithographic quality of the final mask, while ensuring perfect geometric consistency. The fewer the number of unique patterns, the more the system can reduce processing time, power, and memory requirements for performing layout processing and validations.

Figure 7:
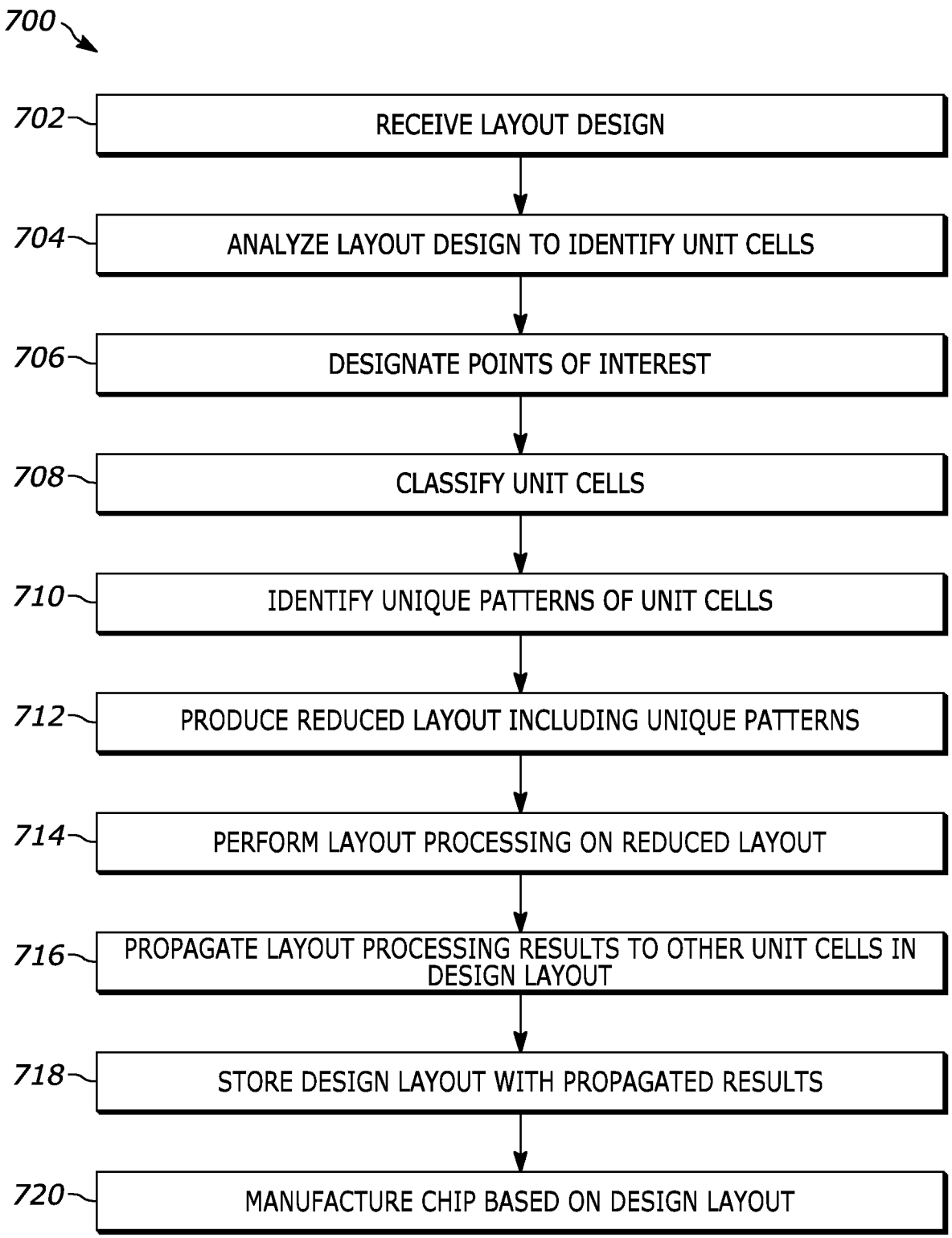
FIG. 7 illustrates a process 700 for chip design in accordance with disclosed embodiments.

FIG. 7 illustrates a process 700 for chip design that can be performed, for example, by a computer system 101 as described herein, referred to generically as the "system" below.

The system receives a layout design (702). The layout design can be for a lithographic process or can be a layout in its early design phases. The layout design can represent an entire chip or a portion of a chip to be manufactured, such as any abstraction level standard cell, set of unit cells, medium level block, or full chip. "Receiving" can include loading from storage, receiving from another device or process, or otherwise.

The system analyzes the layout design to identify unit cells in the layout design (704). As part of this step or another step, the system can create, instantiate, and otherwise store data in a hierarchical database to include the unit cells.

The system designates points of interest corresponding to each of the identified unit cells (706). The POIs can be stored in the hierarchical database.

The system uses the points of interest to classify the unit cells into a plurality of classifications, each classification including one or more unit cells (708). The classifications can be stored in the hierarchical database, such as properties of each unit cell.

The system identifies unique patterns of the unit cells (710), where each unique pattern represents classification of a unit cell that is not a transformation of another unit cell with the same classification. The unique patterns can be stored in the hierarchical database. The identification can be based, in part, on the stored properties of each unit cell. The unique patterns can also be stored as properties of each unit cell.

The system produces a reduced layout including only unique patterns of unit cells of each classification (712). The reduced layout can be stored in the hierarchical database.

The system performs layout processing on the reduced layout (714), as opposed to the full layout design, to produce process results. The layout processing can include, for example, performing RET processes, for example including an OPC process, defining SRAFs, performing verification processes, performing simulation processes, and/or performing self-checking processes on the reduced layout as described herein. The process results can include layout modifications, such as SRAFs, OPC structures, and other specific layout data that is useful or necessary for improving the lithographic manufacturing processes and can also include process metadata such as properties of the unit cells in the reduced layout as stored in the hierarchical database. The layout processing can include machine learning routines to identify and refine layout modifications and other data.

The system propagates the process results from each of the unit cells in the reduced layout (the "source" unique-pattern unit cells) to other unit cells of the full layout design having the same classification as the respective source layout cell (the "target" unit cells having corresponding respective patterns) (716). In specific embodiments, propagating the process results includes propagating the metadata, such as any properties, including feature vectors and others, but not propagating the layout modifications, while other embodiments, of course can include propagating all process results including any layout modifications.

The system stores the full design layout, including the propagated process results (718).

The system can thereafter control manufacture of a physical chip according to the stored full design layout (720).

Those skilled in the art will recognize that, for simplicity and clarity, the full structure and operation of all data processing systems or computer systems suitable for use with the present disclosure is not being depicted or described herein. Instead, only so much of a data processing system or computer system as is unique to the present disclosure or necessary for an understanding of the present disclosure is depicted and described. The remainder of the construction and operation of the data processing system may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as ROMs or EEPROMs, and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form. Various process steps can be omitted, repeated, performed sequentially or concurrently with other steps or processes, or combined with other steps or processes. The features or steps disclosed herein can be combined or exchanged with others within the scope of the disclosure.

The following documents are incorporated by reference herein:

Model based CAOPC flow for memory chips to improve performance and consistency of RET solutions, Jayaram, Mousa, et al., Proc. SPIE. 11327, Optical Microlithography XXXIII, Mar. 23, 2020.

Model based cell-array OPC development for productivity improvement in memory device fabrication, Seoud, Hany, et al., Proc. SPIE. 10587, Optical Microlithography XXXI, Mar. 20, 2018.

U.S. Pat. No. 10,691,869.

U.S. Pat. No. 8,402,397.

United States Patent Publication US 2018/0307791A1.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U. S. C. § 112(f).

What is claimed is:

1. A method performed by a computer system, comprising:
    receiving, by a computer system, a layout design;
    analyzing the layout design, by the computer system, to identify unit cells in the layout design, wherein each unit cell represents a repeating geometric structure in the layout design;
    designating, by the computer system, points of interest each corresponding to a respective one of the unit cells, and storing properties corresponding to each point of interest in a hierarchical database;
    classifying, by the computer system, the unit cells into a plurality of classifications using the points of interest and the corresponding properties;
    identifying unique patterns of the unit cells by the computer system, wherein each unique pattern represents a classification of a unit cell that is not a transformation of another unit cell with the same classification;
    producing, by the computer system, a reduced layout including the unique patterns of unit cells;
    performing, by the computer system, layout processing on the reduced layout to produce process results; and
    propagating, by the computer system, the process results from each of the unique patterns of unit cells in the reduced layout to other unit cells of the layout design having the same classification.

2. The method of claim 1, wherein each unit cell represents a geometric structure for a bit of a memory.

3. The method of claim 1, wherein each unit cell represents a geometric structure for a logic gate.

4. The method of claim 1, wherein the properties corresponding to each point of interest includes one or more of a location of the corresponding unit cell, an orientation of the corresponding unit cell, a location context of the corresponding unit cell with respect to other unit cells, or a location context of the corresponding unit cell with respect to external structures.

5. The method of claim 4, wherein the location context of the corresponding unit cell with respect to other unit cells or with respect to external structures is determined according to a predetermined interaction distance size.

6. The method of claim 1, wherein the process results include layout modifications and process metadata, and propagating the process results from each of the unique patterns of the unit cells in the reduced layout to other unit cells of the layout design having the same classification includes propagating only the process metadata and not propagating the layout modifications.

7. The method of claim 6, wherein the process metadata includes the properties corresponding to each point of interest corresponding to each unit cell in the reduced layout.

8. The method of claim 6, wherein the process metadata includes feature vectors corresponding to each unit cell in the reduced layout.

9. The method of claim 1, wherein the properties corresponding to each point of interest corresponding to each unit cell includes the classification of the respective unit cell.

10. A computer system comprising:
    a processor; and
    an accessible memory, the computer system configured to:
        receive a layout design;
        analyze the layout design to identify unit cells in the layout design, wherein each unit cell represents a repeating geometric structure in the layout design;
        designate points of interest each corresponding to a respective one of the unit cells, and storing properties corresponding to each point of interest in a hierarchical database;
        classify the unit cells into a plurality of classifications using the points of interest and the corresponding properties;
        identify unique patterns of the unit cells, wherein each unique pattern represents a classification of a unit cell that is not a transformation of another unit cell with the same classification;
        produce a reduced layout including the unique patterns of unit cells;
        perform layout processing on the reduced layout to produce process results; and
        propagate the process results from each of the unique patterns of unit cells in the reduced layout to other unit cells of the layout design having the same classification.

11. The computer system of claim 10, wherein each unit cell represents a geometric structure for a bit of a memory.

12. The computer system of claim 10, wherein each unit cell represents a geometric structure for a logic gate.

13. The computer system of claim 10, wherein the properties corresponding to each point of interest includes one or more of a location of the corresponding unit cell, an orientation of the corresponding unit cell, a location context of the corresponding unit cell with respect to other unit cells, or a location context of the corresponding unit cell with respect to external structures.

14. The computer system of claim 13, wherein the location context of the corresponding unit cell with respect to other unit cells or with respect to external structures is determined according to a predetermined interaction distance size.

15. The computer system of claim 10, wherein the process results include layout modifications and process metadata, and propagating the process results from each of the unique patterns of the unit cells in the reduced layout to other unit cells of the layout design having the same classification includes propagating only the process metadata and not propagating the layout modifications.

16. The computer system of claim 15, wherein the process metadata includes the properties corresponding to each point of interest corresponding to each unit cell in the reduced layout.

17. The computer system of claim 15, wherein the process metadata includes feature vectors corresponding to each unit cell in the reduced layout.

18. The computer system of claim 10, wherein the properties corresponding to each point of interest corresponding to each unit cell includes the classification of the respective unit cell.

19. A non-transitory computer-readable medium storing with executable instructions that, when executed, cause one or more computer systems to:
receive a layout design;
analyze the layout design to identify unit cells in the layout design, wherein each unit cell represents a repeating geometric structure in the layout design;
designate points of interest each corresponding to a respective one of the unit cells, and storing properties corresponding to each point of interest in a hierarchical database;
classify the unit cells into a plurality of classifications using the points of interest and the corresponding properties;
identify unique patterns of the unit cells, wherein each unique pattern represents a classification of a unit cell that is not a transformation of another unit cell with the same classification;
produce a reduced layout including the unique patterns of unit cells;
perform layout processing on the reduced layout to produce process results; and
propagate the process results from each of the unique patterns of unit cells in the reduced layout to other unit cells of the layout design having the same classification.

20. The non-transitory computer-readable medium of claim 19, wherein the process results include layout modifications and process metadata, and propagating the process results from each of the unique patterns of the unit cells in the reduced layout to other unit cells of the layout design having the same classification includes propagating only the process metadata and not propagating the layout modifications.

* * * * *